United States Patent
Negishi

(10) Patent No.: US 11,043,355 B2
(45) Date of Patent: Jun. 22, 2021

(54) VACUUM COOLING APPARATUS AND ION MILLING APPARATUS

(71) Applicant: JEOL Ltd., Tokyo (JP)

(72) Inventor: Tsutomu Negishi, Tokyo (JP)

(73) Assignee: JEOL LTD., Tokyo (JP)

( * ) Notice: Subject to any disclaimer, the term of this patent is extended or adjusted under 35 U.S.C. 154(b) by 0 days.

(21) Appl. No.: 16/701,650

(22) Filed: Dec. 3, 2019

(65) Prior Publication Data
US 2020/0185187 A1    Jun. 11, 2020

(30) Foreign Application Priority Data

Dec. 7, 2018    (JP) .............................. JP2018-229890

(51) Int. Cl.
| | | |
|---|---|---|
| *H01J 37/18* | (2006.01) | |
| *H01J 37/16* | (2006.01) | |
| *H01J 37/305* | (2006.01) | |

(52) U.S. Cl.
CPC .............. *H01J 37/18* (2013.01); *H01J 37/16* (2013.01); *H01J 37/3053* (2013.01); *H01J 2237/006* (2013.01); *H01J 2237/1825* (2013.01); *H01J 2237/2001* (2013.01); *H01J 2237/2002* (2013.01)

(58) Field of Classification Search
CPC ..... H01J 37/16; H01J 37/18; H01J 2237/1825
See application file for complete search history.

(56) References Cited

U.S. PATENT DOCUMENTS

| | | | |
|---|---|---|---|
| 4,109,157 A | * | 8/1978 | Tanaka ...................... C23C 8/36 118/724 |
| 6,674,076 B1 | | 1/2004 | Orfino et al. |
| 2012/0000609 A1 | * | 1/2012 | Do .................... H01J 37/32568 156/345.48 |
| 2016/0155602 A1 | | 6/2016 | Kamino et al. |
| 2019/0096637 A1 | | 3/2019 | Asano et al. |

FOREIGN PATENT DOCUMENTS

| | | |
|---|---|---|
| JP | 2013527578 A | 6/2013 |
| JP | WO2017208311 A1 | 12/2017 |
| WO | 2015016039 A1 | 2/2015 |

OTHER PUBLICATIONS

Extended European Search Report issued in EP19213474.0 dated May 4, 2020.
Office Action issued in JP2018-229890 dated Feb. 2, 2021.

* cited by examiner

*Primary Examiner* — Eliza W Osenbaugh-Stewart
(74) *Attorney, Agent, or Firm* — The Webb Law Firm

(57) ABSTRACT

An ion milling apparatus includes a sample holder, a vacuum chamber, an evacuation section, a vacuum gauge, a heater, a gas inlet assembly, and a control section. The evacuation section vents gas in the interior space of the vacuum chamber. The vacuum gauge measures the pressure in the interior space of the vacuum chamber. The heater heats the sample holder. The gas inlet assembly admits a dry gas containing no moisture into the interior space of the vacuum chamber. When the pressure in the interior space has reached below a given pressure, the control section controls the gas inlet assembly based on information about the pressure in the interior space so as to admit the dry gas into the vacuum chamber.

5 Claims, 3 Drawing Sheets

[FIG. 1]
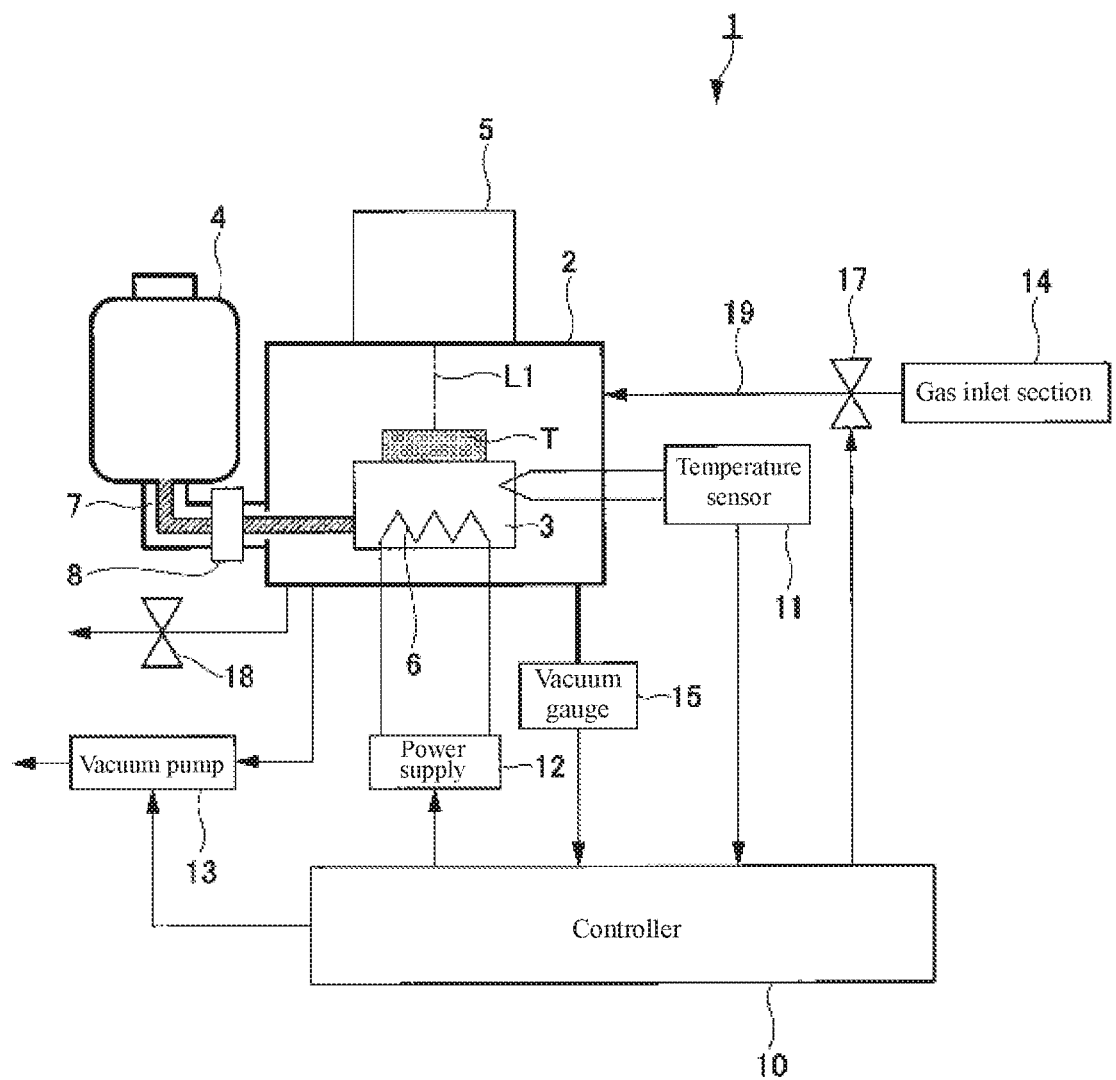

[FIG. 2]
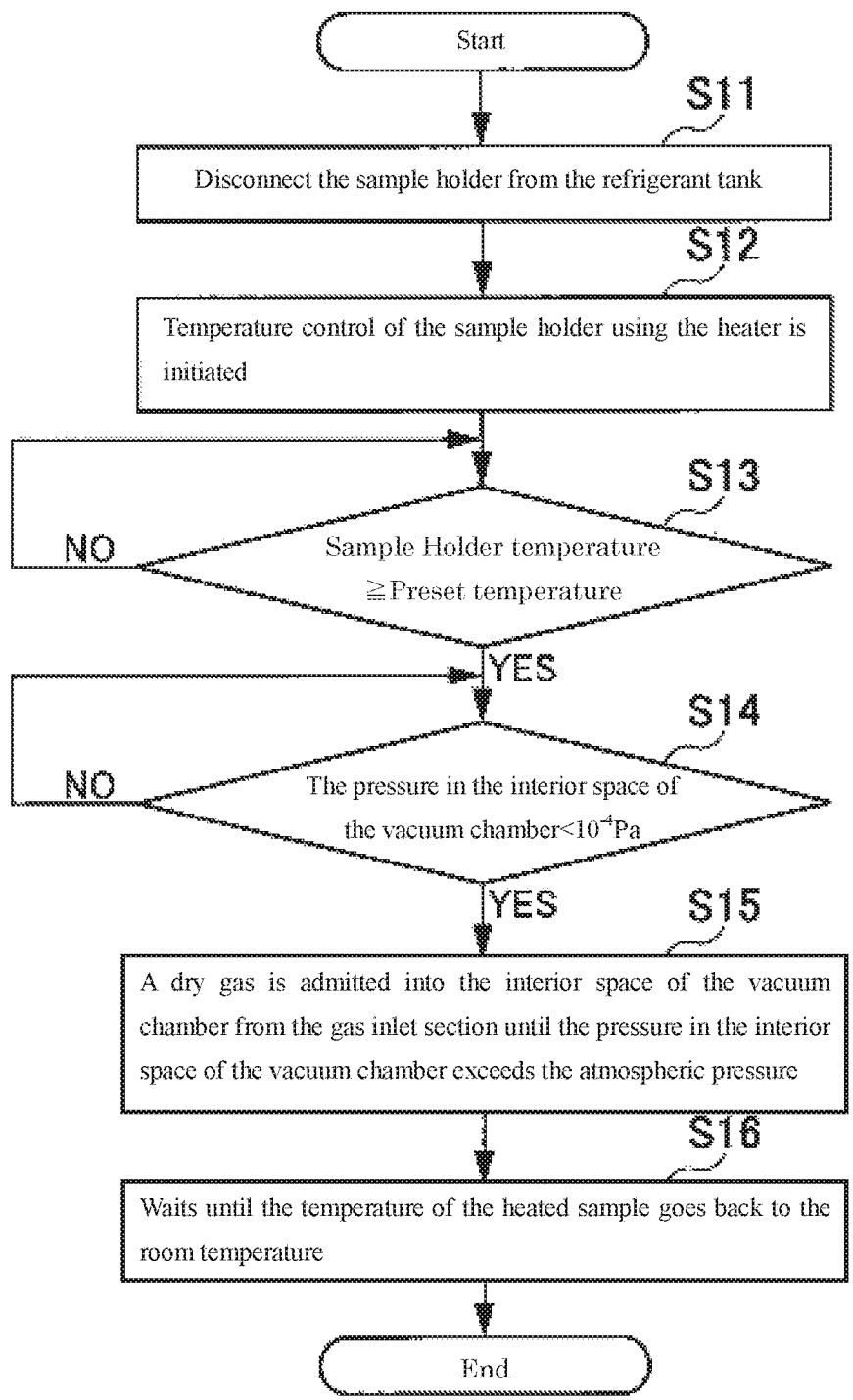

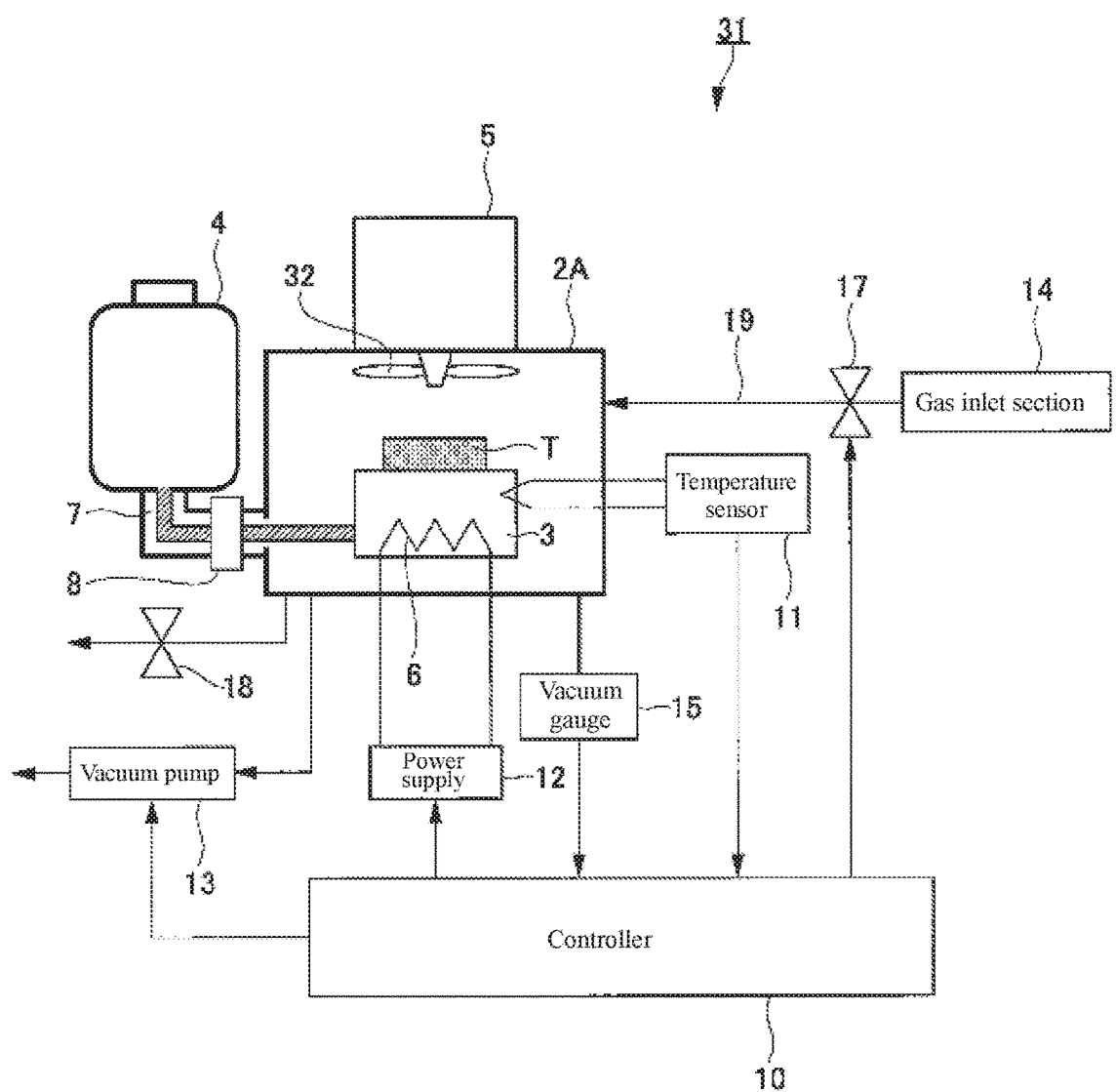
[FIG. 3]

VACUUM COOLING APPARATUS AND ION MILLING APPARATUS

CROSS-REFERENCE TO RELATED APPLICATION

This application claims priority to Japanese Patent Application No. 2018-229890 filed Dec. 7, 2018, the disclosure of which is hereby incorporated by reference in its entirety.

BACKGROUND OF THE INVENTION

Field of the Invention

The present invention relates to a vacuum cooling apparatus and ion milling apparatus in which a sample is held in a vacuum state.

Description of Related Art

Generally, a sample observed through an electron microscope such as a scanning electron microscope (TEM) or a transmission electron microscope (SEM) is processed into a shape suitable for observation by irradiating the sample with an ion beam from an ion milling apparatus so as to etch the sample. The sample is processed while placed in a vacuum chamber, i.e., in a vacuum state. At the same time, the sample is cooled to suppress the effects of heat generated by the ion beam. After the processing, the vacuum chamber is opened to atmosphere and then the sample is taken out.

One example of such an ion milling apparatus is found in WO/2015/016039, which sets forth a technique equipped with a heater for heating the inside of a vacuum chamber, a gas source for admitting a gas into the vacuum chamber, and a controller for controlling the gas source. In this known technique, the controller controls the gas source such that the pressure inside the vacuum chamber is kept at a desired level during heating by the heater.

In the technique set forth in WO/2015/016039, however, a gas is admitted without checking the pressure condition in the interior space of the vacuum chamber. If the inside of the vacuum chamber is heated, moisture adhering to the vacuum chamber and to the sample will evaporate. Under this condition, if a gas is admitted, the evaporated moisture readheres to the sample and becomes heated by the gas. This poses the danger that moisture condensation will form on the sample.

SUMMARY OF THE INVENTION

In view of the foregoing problem, it is an object of the present invention to provide a vacuum cooling apparatus and ion milling apparatus capable of suppressing moisture condensation on a sample and of heating it in a short time.

In order to solve the foregoing problem and thus to achieve the above-described object, a vacuum cooling apparatus of the present invention has: a sample holder for holding a sample; a vacuum chamber having an interior space where the sample holder is positioned; an evacuation section; a vacuum gauge; a heater, a gas inlet assembly; and a control section.

The evacuation section vents gas in the interior space of the vacuum chamber. The vacuum gauge measures the pressure in the interior space of the vacuum chamber. The heater heats the sample holder. The gas inlet assembly admits a dry gas containing no moisture into the interior space of the vacuum chamber. When the pressure in the interior space has reached below a given pressure, the control section controls the gas inlet assembly based on information about the pressure in the interior space measured by the vacuum gauge so as to admit the dry gas into the vacuum chamber.

An ion milling apparatus of the present invention comprises: a sample holder for holding a sample; a vacuum chamber having an interior space where the sample holder is positioned; an ion source; an evacuation section; a vacuum gauge; a heater; a gas inlet assembly; and a control section.

The ion source directs an ion beam at the sample held to the sample holder. The evacuation section vents gas in the interior space of the vacuum chamber. The vacuum gauge measures the pressure in the interior space of the vacuum chamber. The heater operates to heat the sample holder. The gas inlet assembly admits a dry gas containing no moisture into the interior space of the vacuum chamber. When the pressure in the interior space has reached below a given pressure, the control section controls the gas inlet assembly based on information about the pressure in the interior space measured by the vacuum gauge so as to admit the dry gas into the vacuum chamber.

According to the vacuum cooling apparatus and ion milling apparatus of the above-described configuration, moisture condensation on the sample can be suppressed. Also, the sample can be heated in a short time.

BRIEF DESCRIPTION OF THE DRAWINGS

FIG. 1 is a schematic block diagram of an ion milling apparatus associated with a first embodiment of the present invention.

FIG. 2 is a flowchart illustrating an operational sequence performed by the ion milling apparatus of FIG. 1 for effecting restoration to room temperature.

FIG. 3 is a schematic block diagram of an ion milling apparatus associated with a second embodiment of the present invention.

DESCRIPTION OF THE INVENTION

The preferred embodiments of the vacuum cooling apparatus and ion milling apparatus of the present invention are hereinafter described with reference to FIGS. 1-3, wherein like parts or components are indicated by like reference numerals.

1. First Embodiment 1-1. Configuration of Ion Milling Apparatus

An ion milling apparatus associated with a first embodiment of the present invention is first described by referring to FIG. 1, which is a schematic block diagram of this ion milling apparatus.

The ion milling apparatus shown in FIG. 1 is used as a vacuum cooling apparatus when fabricating samples observed with a scanning electron microscope (SEM) or a transmission electron microscope (TEM). The ion milling apparatus, 1, directs an ion beam at a sample T to etch it into a shape suitable for SEM or TEM observation.

As shown in FIG. 1, the ion milling apparatus 1 has a vacuum chamber 2, a sample holder 3, a refrigerant tank 4, an ion source 5, a heater 6, a length of thermal conductor 7, a connecting/disconnecting mechanism 8, a controller 10 (one example of control section), and a temperature sensor 11. Furthermore, the ion milling apparatus 1 includes a power supply 12 for supplying electric power to the heater 6, a vacuum pump 13 (one example of evacuation section), a gas inlet section 14, and a vacuum gauge 15.

An open-close valve 17 is mounted between the gas inlet section 14 and the vacuum chamber 2. The vacuum chamber 2 has a relief valve 18 to place the chamber in communication with the atmosphere.

The vacuum chamber 2 is shaped like a hollow cylinder and has an interior space in which the sample holder 3 is positioned and detachably mounted on a support stage (not shown) that is placed in the interior space of the vacuum chamber 2. The sample T is releasably held to the sample holder 3.

The sample holder 3 has the heater 6, which in turn is connected with the power supply 12. When electric power is supplied from the power supply 12, the heater 6 heats the sample holder 3. The heater 6 is connected to and controlled by the controller 10.

The temperature sensor 11 is connected with the sample holder 3 and operates to detect the temperature of the sample holder 3. The temperature sensor 11 is also connected with the controller 10 and outputs information about the detected temperature to the controller 10. The temperature sensor 11 may detect the temperature of the sample T held to the sample holder 3 and the temperature of the interior space of the vacuum chamber 2, as well as the temperature of the sample holder 3.

The ion source 5 is installed on the vacuum chamber 2. For example, a gas ion gun that ionizes argon gas by electric discharge and releases argon ions is used as the ion source 5. The ion source 5 emits an ion beam L1 toward the sample T held to the sample holder 3 in the interior space of the vacuum chamber 2.

The ion source 5 is connected with the power supply 12, which in turn applies a voltage to the ion source 5. The power supply 12 is connected to and controlled by the controller 10.

Furthermore, the vacuum pump 13 is connected with the vacuum chamber 2 via piping. The vacuum pump 13 is connected to and controlled by the controller 10. By driving the vacuum pump 13, gas in the interior space of the vacuum chamber 2, e.g., air, is vented.

The refrigerant tank 4 contains a refrigerant such as liquid nitrogen. The refrigerant tank 4 is connected via the length of thermal conductor 7 to the sample holder 3 disposed in the vacuum chamber 2. The refrigerant tank 4 supplies the refrigerant to the sample holder 3 to cool the sample T held to the holder 3.

The connecting/disconnecting mechanism 8 is mounted across the length of thermal conductor 7 and outside the vacuum chamber 2. The connecting/disconnecting mechanism 8 operates to make and break connection of the length of thermal conductor 7, and is connected to and controlled by the controller 10. When a connection of the length of thermal conductor 7 is allowed by the connecting/disconnecting mechanism 8, the refrigerant is supplied from the refrigerant tank 4 into the sample holder 3 via the thermal conductor 7. When the sample holder 3 and sample T are heated, the connection of the thermal conductor 7 is broken by the connecting/disconnecting mechanism 8.

The gas inlet section 14 contains a dry gas such as either an inert gas containing no moisture or air. Examples of the inert gas include nitrogen gas and argon gas. The gas inlet section 14 is connected into the interior space of the vacuum chamber 2 via piping 19 and admits the dry gas into the interior space of the vacuum chamber 2. The piping 19 is provided with the open-close valve 17.

The open-close valve 17 is connected with the controller 10 and opened and closed under control of the controller 10. When the open-close valve 17 is opened, the dry gas is admitted into the interior space of the vacuum chamber 2 from the gas inlet section 14 via the piping 19. The gas inlet section 14, the open-close valve 17, and the piping 9 together constitute a gas inlet assembly.

The vacuum gauge 15 is connected with the vacuum chamber 2 and measures the pressure in the interior space of the vacuum chamber 2. The vacuum gauge 15 is connected with the controller 10 and outputs information about the measured pressure to the controller 10. For example, a vacuum gauge capable of measuring pressures below $10^{-4}$ Pa (such as a Penning vacuum gauge) can be used as the vacuum gauge 15.

Furthermore, the relief valve 18 for placing the interior space of the vacuum chamber 2 and the outside in communication with each other is mounted in the vacuum chamber 2. When the pressure in the interior space of the vacuum chamber 2 exceeds the atmospheric pressure, the relief valve 18 is opened, expelling the gas in the interior space of the vacuum chamber 2 to the outside.

1-2. Example of Operational Sequence of Ion Milling Apparatus for Restoration to Room Temperature One example of an operational sequence of the ion milling apparatus 1 of the above-described configuration for effecting restoration to room temperature is next described by referring to FIGS. 1 and 2. FIG. 2 is a flowchart illustrating the operational sequence for restoration to room temperature.

When processing of the sample T is completed by irradiation with the ion beam L1 of the ion source 5, the ion milling apparatus 1 performs the operational sequence for restoring the temperature of the sample T to the room temperature outside of the vacuum chamber 2. First, as illustrated in FIG. 2, the controller 10 controls the connecting/disconnecting mechanism 8 to disconnect the sample holder 3 from the refrigerant tank 4 (step S11).

Then, the controller 10 controls the power supply 12 to supply electric power to the heater 6. Thus, temperature control of the sample holder 3 using the heater 6 is initiated (step S12). Because electric power is supplied to the heater 6 from the power supply 12, the sample holder 3 holding the sample T thereon is heated.

Then, the temperature sensor 11 detects the temperature of the sample holder 3 and outputs information indicative of the detected temperature information to the controller 10. The controller 10 then makes a decision based on the temperature information from the temperature sensor 11 as to whether the temperature of the sample holder 3 has reached to or above a preset temperature (step S13). For example, the preset temperature used in step S13 is the room temperature outside of the vacuum chamber 2 and appropriately set according to the sample T or processing conditions.

During the processing of step S13, if the decision at step S13 is negative (NO), indicating that the controller 10 has determined that the temperature of the sample holder 3 does not reach the preset temperature, the heating of the sample holder 3 using the heater 6 is continued.

On the other hand, during the processing of step S13, if the decision at step S13 is affirmative (YES), indicating that the controller 10 has determined that the temperature of the sample holder 3 has reached to or above the preset temperature, the controller 10 acquires information about the pressure in the interior space of the vacuum chamber 2 from the vacuum gauge 15.

As the sample holder 3 is heated by the heater 6, the temperature of the sample T held to the sample holder 3 also rises. Where the sample T is larger in thermal conductivity than the sample holder 3, as the sample holder 3 rises in temperature, the temperature of the sample T also rises and reaches the room temperature.

However, where the sample T is smaller in thermal conductivity than the sample holder 3 as encountered where the sample T is made of an organic material or high-polymer material, even if the temperature of the sample holder 3 reaches the room temperature, the temperature of the sample T may be still lower. Under this condition, if the interior space of the vacuum chamber 2 is opened up to atmosphere, moisture contained in the atmosphere and moisture in the sample T may be condensed by the lower-temperature sample T, thus inducing moisture condensation on the surface of the sample T.

Furthermore, because the temperature of the sample T rises, moisture adhering to the sample holder 3 and the sample T evaporates. As a result, the pressure in the interior space of the vacuum chamber 2 increases, i.e., the degree of vacuum in the interior space of the vacuum chamber 2 decreases.

Under this condition, if the temperature of the sample T rises further, evaporated moisture adheres to the sample T. This may result in moisture condensation on the sample T. Therefore, during the processing of the above-described steps S11 to S13, the controller 10 drives the vacuum pump 13 to expel the gas in the interior space of the vacuum chamber 2. Consequently, moisture evaporated through the vacuum pump 13 is also expelled out of the vacuum chamber 2. Since the vacuum pump 13 pumps out the gas in the interior space of the vacuum chamber 2, the pressure in the vacuum chamber 2 increased by the heating of the sample holder 3 decreases again. The result is that the degree of vacuum in the interior space of the vacuum chamber 2 increases again.

Then, the controller 10 makes a decision, based on the pressure information acquired from the vacuum gauge 15, as to whether the pressure in the interior space of the vacuum chamber 2, i.e., the degree of vacuum, has reached below $10^{-4}$ Pa (step S14). If the decision at step S14 is negative (NO), indicating that the controller 10 has determined that the degree of vacuum in the vacuum chamber 2 fails to reach below $10^{-4}$ Pa, the processing of step S14 is continued.

On the other hand, if the decision at step S14 is YES, indicating that the controller 10 has determined that the degree of vacuum in the vacuum chamber 2 has reached below $10^{-4}$ Pa, the controller 10 opens the open-close valve 17. A dry gas is admitted into the interior space of the vacuum chamber 2 from the gas inlet section 14 until the pressure in the interior space of the vacuum chamber 2 exceeds the atmospheric pressure (step S15).

When a dry gas is admitted from the gas inlet section 14 during the processing of step S15, the operation of the vacuum pump 13 may be either stopped or continued. Where the operation of the vacuum pump 13 is continued, the pumping capacity of the vacuum pump 13 is set smaller than the amount of dry gas admitted into the vacuum chamber 2 from the gas inlet section 14.

The vacuum chamber 2 is provided with the relief valve 18 as described above and, therefore, the pressure in the interior space of the vacuum chamber 2 can be suppressed from exceeding the preset pressure for the relief valve 18, e.g., 1 atm.

The ion milling apparatus 1 waits until the temperature of the heated sample T goes back to the room temperature (step S16). Then, the sample T is taken out from the vacuum chamber 2. Thus, the operational sequence performed by the present ion milling apparatus 1 to restore the sample temperature to the room temperature is completed.

By admitting a dry gas into the interior space of the vacuum chamber 2 by the gas inlet section 14, the dry gas fills in the surroundings of the sample T. The admitted dry gas acts as a thermal transfer medium as well as the sample holder 3 in contact with the sample T. Consequently, the temperature of the sample T can be elevated more efficiently than in a vacuum state. Also, during the processing of step S16, it is possible to shorten the time taken until the sample T goes back to the room temperature. As a result, even where the sample T is made of a material of low thermal conductivity such as organic materials and high-polymer materials, the time taken until the sample can be restored to the room temperature can be shortened. This can enhance the work efficiency.

In the present ion milling apparatus 1, the timing at which a dry gas is admitted is determined based on information about the pressure in the internal space of the vacuum chamber 2 measured by the vacuum gauge 15. The dry gas is admitted after the moisture in the internal space of the vacuum chamber 2 is exhausted. Consequently, when the dry gas is admitted, it is possible to prevent the evaporated moisture from readhering to the sample T; otherwise, moisture condensation would form on the sample T.

In the above-described exemplary operation, the dry gas is admitted when the pressure in the internal space of the vacuum chamber 2 has reached below $10^{-4}$ Pa. The timing at which the dry gas is admitted is not restricted to this example. When the dry gas is admitted, the pressure in the interior space of the vacuum chamber 2 is set in various ways according to the volume of the interior space of the vacuum chamber 2 and the type or characteristics of the sample T.

2. Second Embodiment

An ion milling apparatus associated with a second embodiment is next described by referring to FIG. 3, which is a schematic block diagram of this ion milling apparatus.

The ion milling apparatus, 31, associated with the second embodiment is similar to the ion milling apparatus 1 associated with the first embodiment except that a blower is added. Therefore, those parts of the ion milling apparatus 31 which are identical to their counterparts of the ion milling apparatus 1 are indicated by the same reference numerals as in the above referenced figure and a description thereof is omitted.

As shown in FIG. 3, the ion milling apparatus 31 has a vacuum chamber 2A, a sample holder 3, a refrigerant tank 4, an ion source 5, a heater 6, a length of thermal conductor 7, a connecting/disconnecting mechanism 8, a controller 10, and a temperature sensor 11. Furthermore, the ion milling apparatus 1 has a power supply 12, a vacuum pump 13, a gas inlet section 14, a vacuum gauge 15, and the blower, 32.

The blower 32 is placed in the interior space of the vacuum chamber 2A and located in a position where it does not interfere with the ion beam emitted from the ion source 5. The blower 32 is connected to and operatively controlled by the controller 10. By driving the blower 32, air is blown against the sample T and its surroundings, the sample T being held to the sample holder 3.

During the operation of restoring the temperature of the sample T to the room temperature, the controller 10 drives the blower 32 when a dry gas is admitted into the interior space of the vacuum chamber 2A from the gas inlet section 14. This can circulate the dry gas staying around the sample T, thus improving the efficiency of heat transfer to the sample T through the dry gas. As a result, it is possible to shorten the time taken until the cooled sample T is heated to the room temperature.

In other respects, the ion milling apparatus 31 is similar in configuration to the ion milling apparatus 1 associated with the first embodiment and so a description of such similarities is omitted. The ion milling apparatus 31 of this construction can yield advantageous effects similar to those produced by the ion milling apparatus 1 associated with the first embodiment.

It is to be noted that the present invention is not restricted to the embodiments already described and shown in the drawings. Rather, the invention can be practiced in variously modified forms without departing from the gist of the invention delineated by the appended claims.

In the above embodiments, an ion milling apparatus is taken as one example of vacuum cooling apparatus. The vacuum cooling apparatus is not restricted to this example. A cryo-SEM for imaging a sample while cooling it and various other instruments can be used as vacuum cooling apparatus.

The invention claimed is:

1. A vacuum cooling apparatus comprising:
   a sample holder for holding a sample;
   a vacuum chamber having an interior space where the sample holder is positioned;
   an evacuation section for venting gas in the interior space of the vacuum chamber;
   a vacuum gauge for measuring pressure in the interior space of the vacuum chamber;
   a heater for heating the sample holder;
   a temperature sensor for detecting the temperature of the sample holder;
   a gas inlet assembly for admitting a dry gas containing no moisture into the interior space of the vacuum chamber; and
   a control section which, in operation, is configured to:
      control supply of electric power to the heater to initiate heating of the sample holder using the heater;
      determine whether a temperature of the sample holder has reached or is above a preset temperature;
      during controlling the supply of the electric power and determining whether a temperature of the sample holder has reached or is above the preset temperature, drive the evacuation section to vent the gas in the interior space of the vacuum chamber;
      when the temperature is determined to have reached or is above the preset temperature, acquire information about the pressure in the interior space of the vacuum chamber from the vacuum gauge;
      based on the acquired information about the pressure in the interior space measured by the vacuum gauge, determine whether the pressure in the interior space of the vacuum chamber has reached below a given pressure; and
      when the pressure in the interior space has reached below the given pressure, control the gas inlet assembly based on the acquired information about the pressure in the interior space measured by the vacuum gauge so as to admit the dry gas into the vacuum chamber.

2. A vacuum cooling apparatus as set forth in claim 1, wherein when the dry gas is admitted into the interior space from the gas inlet assembly, the control section controls the evacuation section such that a pumping capacity of the evacuation section is smaller than an amount of the dry gas admitted by the gas inlet assembly.

3. A vacuum cooling apparatus as set forth in claim 2, wherein when the dry gas is admitted into the interior space from the gas inlet assembly, the control section stops operation of the evacuation section.

4. A vacuum cooling apparatus as set forth in claim 1, wherein a blower for circulating dry gas staying around the sample held to the sample holder is mounted in the interior space of the vacuum chamber.

5. An ion milling apparatus comprising:
   a sample holder for holding a sample;
   a vacuum chamber having an interior space where the sample holder is positioned;
   an ion source for directing an ion beam at the sample held to the sample holder;
   an evacuation section for evacuating gas in the interior space of the vacuum chamber;
   a vacuum gauge for measuring pressure in the interior space of the vacuum chamber;
   a heater for heating the sample holder;
   a temperature sensor for detecting the temperature of the sample holder;
   a gas inlet assembly for admitting a dry gas containing no moisture into the interior space of the vacuum chamber; and
   a control section which, in operation, is configured to:
      control supply of electric power to the heater to initiate heating of the sample holder using the heater;
      determine whether a temperature of the sample holder has reached or is above a preset temperature;
      during controlling the supply of the electric power and determining whether a temperature of the sample holder has reached or is above the preset temperature, drive the evacuation section to vent the gas in the interior space of the vacuum chamber;
      when the temperature is determined to have reached or is above the preset temperature, acquire information about the pressure in the interior space of the vacuum chamber from the vacuum gauge;
      based on the acquired information about the pressure in the interior space measured by the vacuum gauge, determine whether the pressure in the interior space of the vacuum chamber has reached below a given pressure; and
      when the pressure in the interior space has reached below the given pressure, control the gas inlet assembly based on the acquired information about the pressure in the interior space measured by the vacuum gauge so as to admit the dry gas into the vacuum chamber.

* * * * *